(12) United States Patent
Sagawa et al.

(10) Patent No.: US 8,846,828 B2
(45) Date of Patent: Sep. 30, 2014

(54) CURABLE ORGANOPOLYSILOXANE COMPOSITION AND SEMICONDUCTOR DEVICE

(75) Inventors: Takashi Sagawa, Ichihara (JP); Makoto Yoshitake, Funabashi (JP)

(73) Assignee: Dow Corning Toray Co. Ltd., Chiyoda-Ku, Tokyo (JP)

( * ) Notice: Subject to any disclaimer, the term of this patent is extended or adjusted under 35 U.S.C. 154(b) by 426 days.

(21) Appl. No.: 12/997,177

(22) PCT Filed: Jun. 11, 2009

(86) PCT No.: PCT/JP2009/061138
§ 371 (c)(1),
(2), (4) Date: Jun. 27, 2011

(87) PCT Pub. No.: WO2009/154261
PCT Pub. Date: Dec. 23, 2009

(65) Prior Publication Data
US 2011/0251356 A1    Oct. 13, 2011

(30) Foreign Application Priority Data

Jun. 18, 2008  (JP) ................................. 2008-159723

(51) Int. Cl.
| | |
|---|---|
| C08G 77/38 | (2006.01) |
| C08L 83/04 | (2006.01) |
| C08L 83/05 | (2006.01) |
| C08L 83/07 | (2006.01) |
| C08K 5/54 | (2006.01) |
| G02B 1/04 | (2006.01) |
| H01L 23/29 | (2006.01) |
| C08G 77/12 | (2006.01) |
| C08G 77/20 | (2006.01) |
| H01L 33/48 | (2010.01) |
| C08G 77/00 | (2006.01) |
| H01L 33/56 | (2010.01) |

(52) U.S. Cl.
CPC ............. *H01L 23/296* (2013.01); *C08G 77/12* (2013.01); *H01L 2924/12044* (2013.01); *C08G 77/20* (2013.01); *H01L 33/483* (2013.01); *C08L 83/04* (2013.01); *C08G 77/70* (2013.01); *H01L 33/56* (2013.01)
USPC .......................................... 525/478; 525/479

(58) Field of Classification Search
USPC ........ 525/478, 474, 476, 479; 526/90; 528/25
See application file for complete search history.

(56) References Cited

U.S. PATENT DOCUMENTS

2002/0161140 A1   10/2002   Yoneda et al.

FOREIGN PATENT DOCUMENTS

| JP | 11001619 A | 1/1999 |
|---|---|---|
| JP | 2000198930 A | 7/2000 |
| JP | 2005076003 A | 3/2005 |
| WO | WO 2007001039 A1 * | 1/2007 |
| WO | WO 2007100445 A2 * | 9/2007 |
| WO | WO 2007132910 A1 * | 11/2007 |
| WO | WO 2007148812 A1 | 12/2007 |
| WO | WO 2009154260 A1 | 6/2009 |

OTHER PUBLICATIONS

Shah, Vishu, Handbook of Plastics Testing Technology, 2nd ed. J Wiley & Sons, 1998, p. 465.*
English language translation and abstract for JP 11001619 extracted from the PAJ database Jun. 21, 2001, 26 pages.
English language translation and abstract for JP 2000198930 extracted from the PAJ database Jun. 21, 2011, 36 pages.
English language translation and abstract for JP 2005076003 extracted from the PAJ database Jun. 21, 2011, 21 pages.
PCT International Search Report for Application No. PCT/JP2009/061137 dated Jun. 11, 2009, 3 pages.
PCT International Search Report for Application No. PCT/JP2009/061138 dated Sep. 10, 2009, 3 pages.

* cited by examiner

*Primary Examiner* — Randy Gulakowski
*Assistant Examiner* — Christopher M Rodd
(74) *Attorney, Agent, or Firm* — Howard & Howard Attorneys PLLC

(57) ABSTRACT

A curable organopolysiloxane composition comprising: (A) a branched-chain organopolysiloxane that contains in one molecule at least three alkenyl groups and at least 30 mole % of all silicon-bonded organic groups in the form of aryl groups; (B) a linear-chain organopolysiloxane that contains aryl groups and has both molecular terminals capped with diorganohydrogensiloxy groups; (C) a branched-chain organopolysiloxane that contains in one molecule at least three diorganohydrogensiloxy groups and at least 15 mole % of all silicon-bonded organic groups in the form of aryl groups; and (D) a hydrosilylation catalyst. The composition is capable of forming a cured body that has a high index of refraction and strong adhesion to substrates.

14 Claims, 1 Drawing Sheet

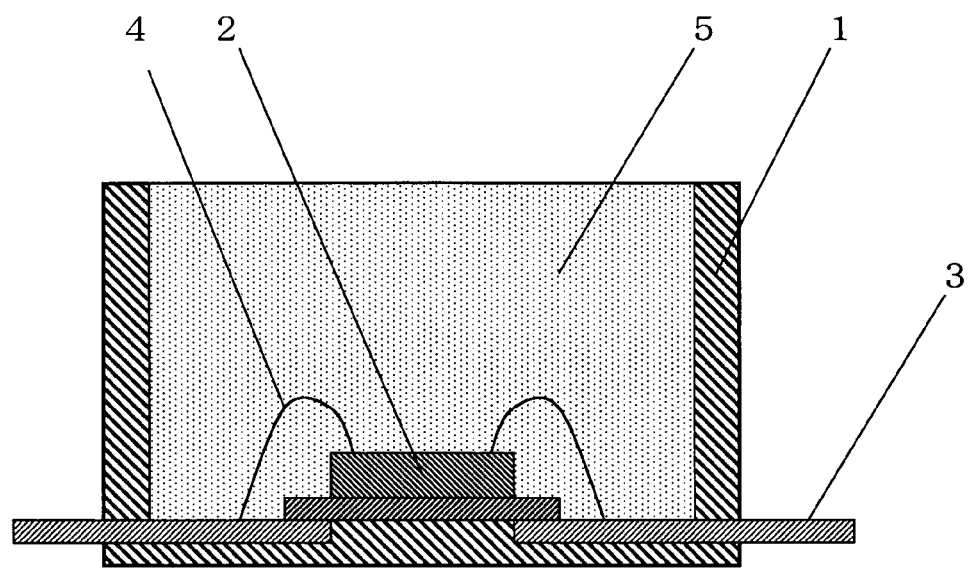

CURABLE ORGANOPOLYSILOXANE COMPOSITION AND SEMICONDUCTOR DEVICE

RELATED APPLICATIONS

This application claims priority to and all the advantages of International Patent Application No. PCT/JP2009/061138, filed on Jun. 11, 2009, which claims priority to Japanese Patent Application No. JP2008-159723, filed on Jun. 18, 2008.

TECHNICAL FIELD

The present invention relates to a curable organopolysiloxane composition and to a semiconductor device that employs this composition.

BACKGROUND ART

Curable organopolysiloxane compositions curable by a hydrosilylation reaction are used as protective or coating agents in the manufacture of semiconductor parts of optical semiconductor devices, such as photo-couplers, light-emitting diodes, solid state imaging elements, etc. Since the light received by the optical elements or emitted from these elements passes through the layers of the aforementioned protective or coating agents, it is required that they should neither absorb nor dissipate the light.

The curable organopolysiloxane composition that after curing by a hydrosilylation reaction forms a cured product having high transmittance and index of refraction can be exemplified, e.g., by a curable organopolysiloxane composition comprising: a branched-chain organopolysiloxane that contains phenyl and alkenyl groups; an organohydrogenpolysiloxane that contains in one molecule at least two silicon-bonded hydrogen atoms; and a hydrosilylation catalyst (see Japanese Unexamined Patent Application Publication (hereinafter referred to as "Kokai") H 11-1619). Another example is a curable organopolysiloxane composition comprising: a diorganopolysiloxane that contains in one molecule at least two alkenyl groups; a branched-chain organopolysiloxane that contains vinyl groups; an organopolysiloxane that contains in one molecule at least two silicon-bonded hydrogen atoms; and a hydrosilylation catalyst (see Kokai 2000-198930). Still another example is a curable organopolysiloxane composition comprising: a diorganopolysiloxane that contains diphenylsiloxane units, a branched-chain organopolysiloxane that contains vinyl and phenyl groups; an organopolysiloxane that contains diorganohydrogensiloxy groups; and a hydrosilylation catalyst (see Kokai 2005-76003).

However, the above-mentioned curable organopolysiloxane compositions produce cured products which have either low optical transmittance or poor adherence to substrates and therefore can be easily peeled off from their surfaces.

It is an object of the present invention to provide a curable organopolysiloxane composition that produces a cured body having a high index of refraction, high optical transmittance and hardness, and good adherence to substrates. The invention also provides a semiconductor device that has semiconductor parts of excellent reliability due to coating thereof with a cured body of the aforementioned composition.

DISCLOSURE OF INVENTION

The curable organopolysiloxane composition of the invention comprises:
(A) a branched-chain organopolysiloxane that contains in one molecule at least three alkenyl groups and at least 30 mole % of all silicon-bonded organic groups in the form of aryl groups;
(B) a linear-chain organopolysiloxane that contains aryl groups and has both molecular terminals capped with diorganohydrogensiloxy groups, wherein component (B) being used in such an amount that the content of silicon-bonded hydrogen atoms contained in component (B) to one mole of alkenyl groups contained in component (A) is in the range of 0.5 to 2 moles;
(C) a branched-chain organopolysiloxane that contains in one molecule at least three diorganohydrogensiloxy groups and at least 15 mole % of all silicon-bonded organic groups in the form of aryl groups, wherein the content of the diorganohydrogensiloxy groups contained in this components being in the range of 1 to 20 mole % per total amount of the diorganohydrogensiloxy groups contained in component (B) and in the present component; and
(D) a hydrosilylation catalyst in an amount required to accelerate curing of the composition.

In the curable organopolysiloxane composition of the invention, component (A) may be a branched-chain organopolysiloxane of the following average unit formula:

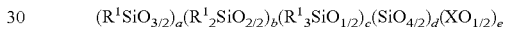

{wherein $R^1$ independently designates substituted or unsubstituted monovalent hydrocarbon groups; however, in one molecule at least three groups designated by $R^1$ are alkenyl groups and at least 30 mole % of all groups designated by $R^1$ are aryl groups; X designates a hydrogen atom or an alkyl group; and "a" is a positive number, "b" is 0 or a positive number, "c" is 0 or a positive number, "d" is 0 or a positive number, "e" is 0 or a positive number, "b/a" is a number ranging from 0 to 10, "c/a" is a number ranging from 0 to 5, "d/(a+b+c+d)" is a number ranging from 0 to 0.3, and "e/(a+b+c+d)" is a number ranging from 0 to 0.4}.

Component (B) of the composition is a linear-chain organopolysiloxane represented by the following general formula:

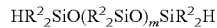

(wherein each $R^2$ independently designates a substituted or unsubstituted univalent hydrocarbon group, which is free of unsaturated aliphatic bonds; however, in one molecule at least 15 mole % of all groups designated by $R^2$ are aryl groups; and "m" is an integer ranging from 1 to 1,000).

Component (C) of the composition may be a branched-chain organopolysiloxane of the following average unit formula:

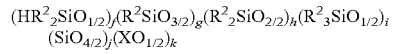

{wherein each $R^2$ independently designates a univalent hydrocarbon group, which is free of unsaturated aliphatic bonds; however, in one molecule at least 15 mole % of all groups designated by $R^2$ are aryl groups; X designates a hydrogen atom or an alkyl group; and "f" is a positive number, "g" is a positive number, "h" is 0 or a positive number, "i" is 0 or a positive number, "j" is 0 or a positive number, "k" is 0 or a positive number, "f/g" is a number ranging from 0.1 to 4, "h/g" is a number ranging from 0 to 10, "i/g" is a number ranging from 0 to 5, "j/(f+g+h+i+j)" is a number ranging from 0 to 0.3, and "k/(f+g+h+i+j)" is a number ranging from 0 to 0.4}.

The curable organopolysiloxane composition of the invention may further contain (E) a linear-chain organopolysiloxane that contains in one molecule at least two alkenyl groups and at least 30 mole % of all silicon-bonded organic groups in the form of aryl groups, wherein component (E) being used in an amount of equal to or less than 100 parts by mass per 100 parts by mass of component (A).

The curable organopolysiloxane composition may have an index of refraction (at 25° C.) in a visible light (589 nm) equal to or greater than 1.5, and a cured product obtained by curing the composition has type D durometer hardness may equal to or greater than 20 and light transmittance (at 25° C.) that is equal to or greater than 80%.

The semiconductor device of the invention has a semiconductor part coated with a cured body of the aforementioned curable organopolysiloxane composition, and the aforementioned semiconductor part may comprise a light-emitting element.

Effects of Invention

The curable organopolysiloxane composition of the invention produces a cured body having a high index of refraction, high optical transmittance and hardness, and good adherence to substrates. The semiconductor device of the invention has semiconductor parts of excellent reliability due to coating thereof with a cured body of the aforementioned composition.

BRIEF DESCRIPTION OF THE DRAWINGS

FIG. 1 is a cross-sectional view of a LED made in accordance with one embodiment of the semiconductor device of the invention.

REFERENCE NUMERALS USED IN THE DESCRIPTION 1 polyphthalamide (PPA) resin case
2 LED chip
3 inner lead
4 bonding wires
5 cured body of curable organopolysiloxane composition

DETAILED DESCRIPTION OF THE INVENTION

The following is a more detailed description of the curable organopolysiloxane composition of the invention.

Component (A) is one of the main components of the composition. Component (A) is a branched-chain organopolysiloxane wherein one molecule contains at least three alkenyl groups, and wherein one molecule contains at least 30 mole % of all silicon-bonded organic groups are aryl groups. The aforementioned alkenyl groups can be specifically exemplified by vinyl, allyl, butenyl, pentenyl, or hexenyl groups. Most preferable are vinyl groups. Furthermore, in order to reduce damping of light that may be caused by refraction, reflection, scattering, etc., when the light passes through the cured product, it is recommended that in one molecule at least 30 mole %, preferably at least 40 mole % of all silicon-bonded organic groups are aryl groups. These aryl groups can be specifically exemplified by phenyl, tolyl, or xylyl groups, most preferable of which are phenyl groups. Other silicon-bonded groups of component (A) may comprise substituted or unsubstituted univalent hydrocarbon groups, except for alkenyl and aryl groups. Examples are methyl, ethyl, propyl, butyl, pentyl, hexyl, heptyl, or similar alkyl groups; benzyl, phenethyl, or similar aralkyl groups; and 3-chloropropyl, 3,3,3-trifluoropropyl, or similar halogenated alkyl groups. In small quantities, component (A) may contain silicon-bonded hydroxyl groups or silicon-bonded alkoxy groups. Such alkoxy groups may be specifically exemplified by methoxy, ethoxy, propoxy, or butoxy groups.

Furthermore, component (A) may comprise an organopolysiloxane represented by the following average unit formula:

$$(R^1SiO_{3/2})_a(R^1{}_2SiO_{2/2})_b(R^1{}_3SiO_{1/2})_c(SiO_{4/2})_d(XO_{1/2})_e$$

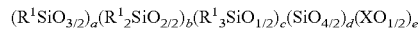

In this formula, $R^1$ independently designates substituted or unsubstituted monovalent hydrocarbon groups, such as methyl, ethyl, propyl, butyl, pentyl, hexyl, heptyl, or similar alkyl groups; vinyl, allyl, butenyl, pentenyl, hexenyl, or similar alkenyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups. However, in one molecule at least three groups designated by $R^1$ are alkenyl groups, and at least 30 mole %, preferably at least 40 mole % of all groups designated by $R^1$ are aryl groups. In this formula, X designates a hydrogen atom or an alkyl group. Such an alkyl group is specifically exemplified by a methyl, ethyl, propyl, or a butyl group, of which the methyl group is preferable. In the formula, "a" is a positive number, "b" is 0 or a positive number, "c" is 0 or a positive number, "d" is 0 or a positive number, "e" is 0 or a positive number, "b/a" is a number ranging from 0 to 10, "c/a" is a number ranging from 0 to 5, "d/(a+b+c+d) is a number ranging from 0 to 0.3, and "e/(a+b+c+d) is a number ranging from 0 to 0.4.

Component (B) is one of the cross-linking agents of the invention. This component comprises a linear-chain organopolysiloxane that contains aryl groups and is capped at both molecular terminals with diorganohydrogensiloxy groups. The silicon-bonded groups of component (B) may be exemplified by substituted or unsubstituted monovalent hydrocarbon groups which are free of unsaturated aliphatic bonds. Specific examples are methyl, ethyl, propyl, butyl, pentyl, hexyl, heptyl, or similar alkyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups. In order to reduce damping of light that may be caused by refraction, reflection, scattering, etc., when the light passes through the cured product, it is recommended that in one molecule at least 15 mole %, preferably at least 30 mole %, and most preferably at least 40 mole % of all silicon-bonded organic groups are aryl groups, in particular, phenyl groups.

Component (B) has a linear molecular structure and both molecular terminals capped with diorganohydrogensiloxy groups. Such component (B) is represented by the following general formula:

$$HR^2{}_2SiO(R^2{}_2SiO)_mSiR^2{}_2H.$$

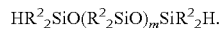

In this formula, each $R^2$ independently designates a substituted or unsubstituted monovalent hydrocarbon group which is free of unsaturated aliphatic bonds. Specific examples are methyl, ethyl, propyl, butyl, pentyl, hexyl, heptyl, or similar alkyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups. In order to reduce damping of light that may be caused by refraction, reflection, scattering, etc., when the light passes through the cured product, it is recommended that in one molecule at least 15 mole %, preferably at least 30 mole %, and most preferably at least 40 mole % of all groups designated by $R^2$ are aryl groups. In the formula, "m" is an integer ranging from 1 to 1,000, preferably from 1 to 100, more preferably from 1 to 50, and most preferably from 1 to 20. If the value of "m" exceeds the recommended upper limit, this will impair either filling properties of the composition or adhesive properties of a cured body obtained from the composition.

Component (B) is added to the composition in such an amount that the content of silicon-bonded hydrogen atoms contained in component (B) to one mole of alkenyl groups contained in components (A) is in the range of 0.5 to 2 moles, preferably 0.7 to 1.5 moles. If the content of component (B) is below the recommended lower limit, this will impair adhesion of a cured body obtained from the composition, to a substrate. If, on the other hand, the added amount of component (B) exceeds the recommended upper limit, this will reduce hardness of the cured body.

Component (C) is also one of the cross-linking agents of the composition. This component is a branched-chain organopolysiloxane that contains in one molecule at least three diorganohydrogensiloxy groups. At least 15 mole % of all silicon-bonded organic groups of this component are aryl groups. The silicon-bonded groups of component (C) can be exemplified by substituted or unsubstituted monovalent hydrocarbon groups, such as methyl, ethyl, propyl, butyl, pentyl, hexyl, heptyl, or similar alkyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups. In order to reduce damping of light that may be caused by refraction, reflection, scattering, etc., when the light passes through the cured product, it is recommended that in one molecule at least 15 mole %, preferably at least 25 mole % of all silicon-bonded organic groups of this component are aryl groups, in particular, phenyl groups.

Aforementioned component (C), which is a branched-chain organopolysiloxane, is represented by the following average unit formula:

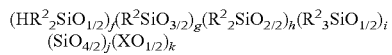

$(HR^2_2SiO_{1/2})_f(R^2SiO_{3/2})_g(R^2_2SiO_{2/2})_h(R^2_3SiO_{1/2})_i$
$(SiO_{4/2})_j(XO_{1/2})_k$

In this formula, each $R^2$ independently designates a univalent hydrocarbon group which is free of unsaturated aliphatic bonds. Each such univalent hydrocarbon group designated by $R^2$ can be exemplified by the same groups as those given for $R^2$ groups above. In order to reduce damping of light that may be caused by refraction, reflection, scattering, etc., when the light passes through the cured product, it is recommended that in one molecule at least 15 mole %, preferably at least 25 mole %, of all silicon-bonded organic groups of this component are aryl groups. The alkyl groups can be exemplified by methyl, ethyl, propyl, or butyl groups, most preferably, methyl groups. Furthermore, in the above formula "f" is a positive number, "g" is a positive number, "h" is 0 or a positive number, "i" is 0 or a positive number, "j" is 0 or a positive number, "k" is 0 or a positive number, "f/g" is a number ranging from 0.1 to 4, "h/g" is a number ranging from 0 to 10, "i/g" is a number ranging from 0 to 5, "j/(f+g+h+i+j)" is a number ranging from 0 to 0.3, and "k/(f+g+h+i+j)" is a number ranging from 0 to 0.4.

Component (C) is added to the composition in such an amount that the content of the diorganohydrogensiloxy groups contained in component (C) to the total amount of diorganohydrogensiloxy groups contained in components (B) and (C) is in the range of 1 to 20 mole %, preferably 2 to 20 mole %, and most preferably 2 to 10 mole %. If the content of component (C) in the composition exceeds the recommended upper limit or is below the recommended lower limit, this will impair adherence of a cured body of the composition to substrates.

Component (D) is a hydrosilylation catalyst, which is used for accelerating cross-linking of the composition. Component (D) may comprise a platinum-based catalyst, rhodium-based catalyst, or a palladium-based catalyst. The platinum-based catalyst is preferable since it significantly accelerates curing of the composition. The platinum-based catalyst can be exemplified by a fine platinum powder, chloroplatinic acid, an alcohol solution of chloroplatinic acid, a platinum-alkenylsiloxane complex, a platinum-olefin complex, or a platinum-carbonyl complex, of which the platinum-alkenylsiloxane complex is preferable. Such an alkenylsiloxane can be exemplified by the 1,3-divinyl-1,1,3,3-tetramethyl disiloxane, 1,3,5,7-tetramethyl-1,3,5,7-tetravinyl cyclotetrasiloxane, substituted alkenylsiloxane which are the aforementioned alkenylsiloxanes having a part of methyl groups substituted with ethyl, phenyl groups, or substituted alkenylsiloxane which are the aforementioned alkenyl siloxanes having a part of vinyl groups substituted with aryl, hexenyl, or similar groups. From the viewpoint of better stability of the platinum-alkenylsiloxane complexes, the use of the 1,3-divinyl-1,1,3,3-tetramethyl-disiloxane is preferable. For further improvement of stability, the aforementioned alkenylsiloxane complexes can be combined with 1,3-divinyl-1,1,3,3-tetramethyl disiloxane, 1,3-diallyl-1,1,3,3-tetramethyl disiloxane, 1,3-divinyl-1,1,3,3-tetraphenyl disiloxane, 1,3,5,7-tetramethyl-1,3,5,7-tetravinyl cyclotetrasiloxane, or similar alkenylsiloxanes, dimethylsiloxane oligomers, or other organosiloxane oligomers. Most preferable are alkenylsiloxanes.

Component (D) is added in amounts required for curing the composition. More specifically, in terms of mass units, this component is added in such an amount that the content of metal atoms of this component ranges from 0.01 to 500 ppm, preferably 0.01 to 100 ppm, and most preferably 0.01 to 50 ppm per mass of the composition. If component (D) is added in an amount less than the recommended lower limit, the obtained composition will not be cured to a sufficient degree. If, on the other hand, the added amount of component (D) exceeds the recommended upper limit, this will cause coloring of a cured product of the composition.

In order to adjust hardness of the composition, it may be additionally combined with (E) a linear organopolysiloxane, wherein one molecule contains at least two alkenyl groups and wherein at least 30% of all silicon-bonded organic groups are aryl groups. Specific examples of the alkenyl groups of component (E) are vinyl, allyl, butenyl, pentenyl, or hexenyl groups, of which vinyl groups are preferable. In order to reduce damping of light that may be caused by refraction, reflection, scattering, etc., when the light passes through the cured product, it is recommended that in one molecule at least 30 mole %, preferably at least 40 mole % of all silicon-bonded organic groups of this component are aryl groups, in particular, phenyl groups. Other silicon-bonded groups of component (E), except for the alkenyl and phenyl groups may comprise substituted or unsubstituted univalent hydrocarbon groups, such as methyl, ethyl, propyl, butyl, pentyl, hexyl, heptyl, or similar alkyl groups; tolyl, xylyl, or similar aryl groups; benzyl, phenethyl, or similar aralkyl groups; and 3-chloropropyl, 3,3,3-trifluoropropyl, or similar halogenated alkyl groups.

Aforementioned component (E) is an organopolysiloxane that can be represented by the following general formula:

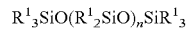

$R^1_3SiO(R^1_2SiO)_nSiR^1_3$

In this formula, $R^1$ independently designates substituted or unsubstituted monovalent hydrocarbon groups, which may be defined by the same groups that have been exemplified for $R^1$ above. However, in one molecule at least two groups designated by $R^1$ are alkenyl groups, preferably vinyl groups. Furthermore, in order to reduce damping of light that may be caused by refraction, reflection, scattering, etc., when the light passes through the cured product, it is recommended that in one molecule at least 30 mole %, preferably at least 40 mole % of all groups designated by $R^1$ are aryl groups, in particular, phenyl groups.

Although there are no restrictions with regard to viscosity of component (E) at 25° C., it is recommended that the viscosity of this component is in the range of 10 to 1,000,000 mPa·s, preferably 100 to 50,000 mPa·s. If the viscosity is below the recommended lower limit, this will impair mechanical strength of a cured body of the composition, and, if, on the other hand, the viscosity exceeds the recommended upper limit, this will impair handleability and workability of the composition.

There are no special restrictions with regard to the amount in which component (E) can be added to the composition, but it is preferable to add this component in an amount of not more than 100 parts by mass, preferably not more than 70 parts by mass per 100 parts by mass of component (A). If the amount of component (E) exceeds the recommended upper limit, this will impair hardness of a cured body of the composition.

If necessary, the composition may incorporate arbitrary components, such as 2-methyl-3-butyn-2-ol, 3,5-dimethyl-1-hexen-3-ol, 2-phenyl-3-butyn-2-ol, or similar alkyn alcohols; 3-methyl-3-penten-1-yne, 3,5-dimethyl-3-hexen-1-yne, or a similar enyne-based compound; 1,3,5,7-tetramethyl-1,3,5,7-tetravinyl cyclotetrasiloxane, 1,3,5,7-tetramethyl-1,3,5,7-tetrahexenyl cyclotetrasiloxane, benzotriazole or similar reaction inhibitors. Although there are no special restrictions with regard to the amounts in which the aforementioned reaction inhibitors can be used, it is recommended to add the reaction inhibitors in an amount of 0.0001 to 5 parts by mass per 100 parts by mass of the sum of components (A) to (D) or components (A) to (E).

In order to improve adhesive properties of the composition, an adhesion improver can be added. Such an adhesion improver may comprise an organic silicon compound that contains in one molecule at least one silicon-bonded alkoxy group. This alkoxy group can be exemplified by a methoxy, ethoxy, propoxy, butoxy, or a methoxyethoxy group, of which the methoxy group is preferable. Silicon-bonded groups of the organic silicon compound other than the alkoxy group may comprise an alkyl, alkenyl, aryl, aralkyl, halogenated alkyl, or a similar substituted or unsubstituted univalent hydrocarbon group; 3-glycidoxypropyl, 4-glycidoxybutyl, or a similar glycidoxyalkyl group; 2-(3,4-epoxycyclohexyl) ethyl, 3-(3,4-epoxycyclohexyl)propyl, or a similar epoxycyclohexylalkyl group; 4-oxiranylbutyl, 8-oxiranyloctyl, or similar oxiranylalkyl group, or another epoxy-containing univalent organic group; 3-methacryloxypropyl, or a similar acryl-containing univalent hydrocarbon group; as well as a hydrogen atom. It is preferable that such an organic silicon compound contains a group capable of reacting with the alkenyl groups or silicon-bonded hydrogen atoms contained in the composition of the invention. Specific examples of such groups are silicon-bonded alkenyl groups or silicon-bonded hydrogen atoms. From the viewpoint of imparting better adhesive strength to various substrates, it is recommended that the aforementioned organic silicon compound contains in one molecule at least one epoxy-containing univalent organic group. Such organic silicon compounds may comprise organosilane compounds, organosiloxane oligomers, and alkyl silicates. The organosiloxane oligomers may have linear, partially branched linear, branched, cyclic, or network-like molecular structures. Examples of these organic silicon compounds are the following: 3-glycidoxypropyl trimethoxysilane, 2-(3,4-epoxycyclohexyl)ethyl trimethoxysilane, 3-methacryloxypropyl trimethoxysilane, or a similar silane compound; a siloxane compound having in one molecule at least one silicon-bonded alkenyl group or silicon-bonded hydrogen atoms, and at least one silicon-bonded alkoxy group; a mixture of a silane compound or a siloxane compound having in one molecule at least one silicon-bonded alkoxy group with a siloxane compound having in one molecule at least one silicon-bonded hydroxy group and at least one silicon-bonded alkenyl group; a methylpolysilicate, ethylpolysilicate, or an epoxy-containing polysilicate. Such adhesion improvers may be in the form of low-viscosity liquids. Although there are no special restrictions with regard to the viscosity of these liquids, it may be recommended to have their viscosity in the range of 1 to 500 mPa·s at 25° C. Also there are no restrictions with the regard to the amounts in which the adhesion improvers can be added but it can be recommended to add such a component in an amount of 0.01 to 10 parts by mass per 100 parts by mass of the composition.

Within the limits not contradictory to the objects of the invention, the composition may contain some arbitrary components, such as silica, glass, alumina, zinc oxide, or a similar inorganic filler; a powdered polymethacrylic resin, or similar organic resin powders; as well as heat-resistant agents, dyes, pigments, flame retarders, solvents, etc.

In the above-mentioned curable organopolysiloxane composition, the index of refraction (at 25° C.) in a visible light (589 nm) is equal to or greater than 1.5. Furthermore, a cured product obtained by curing the composition has transmittance (at 25° C.) that is equal to or greater than 80%. If the index of refraction of the composition is below 1.5, or the light transmittance through the cured product is below 80%, it will be impossible to impart sufficient reliability to a semiconductor device having a semiconductor part coated with a cured body of the composition. The index of refraction can be measured, e.g., with the use of an Abbe refractometer. By changing the wavelength of the light source used in the Abbe refractometer, it is possible to measure the index of refraction at any wavelength. Furthermore, the index of refraction can also be determined with the use of a spectrophotometer by measuring a cured body of the composition having an optical path of 1.0 mm.

The composition of the invention is cured at room temperature or by heating. However, for acceleration of the curing process, heating is recommended. The heating temperature is in the range of 50 to 200° C. It is recommended that a cured body obtained by curing the aforementioned composition has type D durometer hardness equal to or greater than 20. The composition of the invention may be used as an adhesive, potting agent, protective agent, coating agent, or underfill agent for parts of electrical and electronic devices. In particular, since the composition has high light-transmittance, it is suitable for use as an adhesive, potting agent, protective agent, or underfill agent for semiconductor parts of optical devices.

The semiconductor device of the invention will now be described in more details.

The device contains a semiconductor part coated with a cured body of the aforementioned curable organopolysiloxane composition. The aforementioned semiconductor part may comprise a diode, transistor, thyristor, solid-state imaging element, monolithic IC, or a semiconductor part of a hybrid IC. The semiconductor device itself may comprise a diode, light-emitting diode (LED), transistor, thyristor, photocoupler, CCD, monolithic IC, hybrid IC, LSI, or a VLSI. In particular, in view of high light transmittance, the device most suitable for realization of the invention is a light-emitting diode (LED).

FIG. 1 is a cross-sectional view of a single surface-mounted LED shown as an example of the device of the invention. The LED shown in FIG. 1 comprises a semiconductor (LED) chip 2 die-bonded to a frame, while the semiconductor (LED) chip 2 and a lead frame 3 are wire-bonded via bonding wires 4. The semiconductor (LED) chip 2 is coated with a cured body 5 of the curable organopolysiloxane composition of the invention.

A method of manufacturing the surface-mounted LED shown in FIG. 1 consists of die-bonding the semiconductor (LED) chip 2 to the frame, wire-bonding the semiconductor (LED) chip 2 and the lead frame 3 by means of the bonding wires 4, applying the curable organopolysiloxane composition of the invention onto the semiconductor (LED) chip 2, and then curing the composition by heating it to a temperature in the range of 50 to 200° C.

EXAMPLES

The curable organopolysiloxane composition and the semiconductor device of the invention will now be described in details by way of practical and comparative examples. All values in these examples were obtained at 25° C. In the formulae, Me, Ph, Vi, and Ep corresponds to methyl groups, phenyl groups, vinyl groups, and 3-glycidoxypropyl groups, respectively.

Characteristics of a curable organopolysiloxane composition and a cured product thereof were measured by the methods described below.

[Index of Refraction of the Curable Organopolysiloxane Composition]

The index of refraction of the curable organopolysiloxane composition was measured at 25° C. by means of an Abbe refractometer. The source of light utilized visible light of 589 nm.

[Light Transmittance through the Cured Product]

The curable organopolysiloxane composition was sandwiched between two glass plates and cured for 1 hour at 150° C., and then light transmittance through the obtained cured body (optical path 0.2 mm) was determined by an automatic spectrophotometer at 25° C. capable of measuring at an arbitrary wavelength of the visible light in the wavelength range of 400 nm to 700 nm. Transmittance of light was measured through the package and through the glass plate alone, and the difference between the first and second measurements corresponded to transmittance through the cured body of the composition. Light Transmittance at wavelength of 450 nm are shown in Table 1.

[Hardness of the Cured Product]

The curable organopolysiloxane composition was formed into a sheet-like cured product by press-forming for 1 hour at 150° C. Hardness of the obtained sheet-like cured product was measured in accordance with JIS K 6253 by means of a type D durometer.

[Strength of Adhesion to a Polyphthalamide (PPA) Resin Plate]

Two polytetrafluoroethylene-resin spacers (width: 10 mm; length: 20 mm; thickness: 1 mm) were sandwiched between two polyphthalamide (PPA) resin plates (width: 25 mm; length: 50 mm; thickness: 1 mm), the remaining space between the plates was filled with the curable organopolysiloxane composition, the package was fixed by means of clips and placed into a hot-air-circulation oven for curing the composition during 1 hour at 150° C. The cured product was cooled to room temperature, the clips and spacers were removed, and the aforementioned polyphthalamide resin plates were pulled in opposite horizontal directions on a tensile tester for measuring stress at rupture.

[Strength of Adhesion to an Aluminum Plate]

Two polytetrafluoroethylene-resin spacers (width: 10 mm; length: 20 mm; thickness: 1 mm) were sandwiched between two aluminum plates (width: 25 mm; length: 75 mm; thickness: 1 mm), the remaining space between the plates was filled with the curable organopolysiloxane composition, the package was fixed by means of clips and placed into a hot-air-circulation oven for curing the composition during 1 hour at 150° C. The cured product was cooled to room temperature, the clips and spacers were removed, and the aforementioned aluminum plates were pulled in opposite horizontal directions on a tensile tester for measuring stress at rupture.

Following this, a surface-mounted-type light-emitting diode (LED) was manufactured with the curable organopolysiloxane composition.

[Manufacturing of Surface-Mounted-Type Light Emitting Diode (LED)]

Inner leads were placed on the bottoms of sixteen cylindrical polyphthalamide (PPA) resin cases (inner diameter: 2.0 mm; depth: 1.0 mm) and extended to the outside of the cases through their side walls. LED chips were placed over the inner leads on the central bottom parts of the cases, and the LED chips were electrically connected to the inner leads by bonding wires, whereby semi-products of the devices were obtained. By means of a dispenser, the interiors of the polyphthalamide resin cases were filled with preliminarily de-aerated curable organopolysiloxane compositions described in respective practical and comparative examples, and the compositions were cured in a heating oven for 30 min. at 100° C. and then for 1 hour at 150° C., whereby sixteen surface-mounted light-emitting diodes (LED's) of the type shown in FIG. 1 were produced.

[Percentage of Peeling at the Initial Stage]

Conditions of peeling of the hot cured body of the composition from the inner walls of the polyphthalamide (PPA) case were observed under an optical microscope on all sixteen surface-mounted light-emitting diodes (LED's), and the percentage of peeled was determined as the ratio of the number of peeled samples to 16.

[Percentage of Peeling after Retention Under Conditions of Constant Temperature and Constant Humidity]

All sixteen surface-mounted light-emitting diodes (LED's) were held for 72 hours in air at a temperature of 30° C. and relative humidity of 70%, and after cooling to room temperature (25° C.), conditions of peeling of the cured body of the composition from the inner walls of the polyphthalamide (PPA) cases 1 were observed under an optical microscope, and the percentage of peeling was determined as the ratio of the peeled samples to 16.

[Percentage of Peeling after 30 Sec. Retention at 280° C.]

All sixteen surface-mounted light-emitting diodes (LED's) were held for 30 sec. in an oven at 280° C. After cooling to room temperature (25° C.), conditions of peeling of the cured body of the composition from the inner walls of the polyphthalamide (PPA) cases were observed under an optical microscope, and the percentage of peeling was determined as the ratio of the peeled samples to 16.

[Percentage of Peeling after Cyclic Thermal Shock]

After holding for 30 sec. at 280° C., sixteen surface-mounted diodes (LED's) were retained for 30 min. at −40° C., then for 30 min. at +100° C., and the aforementioned "−40° C.↔+100° C." cycle was repeated four times. Following this, the LED's were cooled to room temperature (25° C.), conditions of peeling of the hot cured body from the inner walls of the polyphthalamide (PPA) case were observed under an optical microscope, and the percentage of peeling was determined as the ratio of the peeled samples to 16.

Practical Example 1

A curable organopolysiloxane composition having a viscosity of 3,500 mPa·s was prepared by uniformly mixing the following components:

70 parts by mass of a branched-chain represented by the following average unit formula:

$(PhSiO_{3/2})_{0.75}(ViMe_2SiO_{1/2})_{0.25}$ (content of vinyl groups=5.6 mass %; content of phenyl groups in all silicon-bonded organic groups=50 mole %);

26 parts by mass of a linear-chain organopolysiloxane of the following formula:

$HMe_2SiO(Ph_2SiO)SiMe_2H$ (content of silicon-bonded hydrogen atoms=0.60 mass %; content of phenyl groups in all silicon-bonded organic groups=33 mole %);

2 parts by mass of a branched-chain organopolysiloxane represented by the following average unit formula:

$(PhSiO_{3/2})_{0.6}(HMe_2SiO_{1/2})_{0.4}$ (content of silicon-bonded hydrogen atoms=0.65 mass %; content of phenyl groups in all silicon-bonded organic groups=25 mole %; number-average molecular weight=2,260);

a platinum-1,3-divinyl-1,1,3,3-tetramethyl disiloxane complex (used in the composition in such an amount that in terms of mass units the content of the metallic platinum of the complex was 2.5 ppm); and 0.05 parts by mass of 2-phenyl-3-butyn-2-ol.

Characteristics of the obtained curable organopolysiloxane composition and of a cured body of the composition were measured. A surface-mounted light-emitting diode (LED) utilizing the obtained curable organopolysiloxane composition was manufactured and tested with regard to reliability. The results are shown in Table 1.

Practical Example 2

A curable organopolysiloxane composition having a viscosity of 8,000 mPa·s was prepared by uniformly mixing the following components:

65 parts by mass of a branched-chain organopolysiloxane represented by the following average unit formula:

$(PhSiO_{3/2})_{0.75}(ViMeSiO_{2/2})_{0.10}(Me_2SiO_{2/2})_{0.15}$ (content of vinyl groups=2.3 mass %; content of phenyl groups in all silicon-bonded organic groups=60 mole %);

33 parts by mass of a methylphenylpolysiloxane capped at both molecular terminals with dimethylhydrogensiloxy groups (content of silicon-bonded hydrogen atoms=0.20 mass %; content of phenyl groups in all silicon-bonded organic groups=34 mole %);

2 parts by mass of a branched-chain organopolysiloxane represented by the following average unit formula:

$(PhSiO_{3/2})_{0.5}(HMe_2SiO_{1/2})_{0.5}$ (content of silicon-bonded hydrogen atoms=0.51 mass %; content of phenyl groups in all silicon-bonded organic groups=43 mole %; number-average molecular weight=3,220);

2 parts by mass of an organopolysiloxane represented by the following average unit formula:

$(EpSiO_{3/2})_{0.3}(ViMeSiO_{2/2})_{0.3}(Me_2SiO_{2/2})_{0.3}(MeO_{1/2})_{0.2}$ a platinum-1,3-divinyl-1,1,3,3-tetramethyl disiloxane complex (used in the composition in such an amount that in terms of mass units the content of the metallic platinum of the complex was 2.5 ppm); and 0.05 parts by mass of 2-phenyl-3-butyn-2-ol.

Characteristics of the obtained curable organopolysiloxane composition and of a cured body of the composition were measured. A surface-mounted light-emitting diode (LED) utilizing the obtained curable organopolysiloxane composition was manufactured and tested with regard to reliability. The results are shown in Table 1.

Practical Example 3

A curable organopolysiloxane composition having viscosity of 2,900 mPa·s was prepared by uniformly mixing the following components:

60 parts by mass of a branched-chain organopolysiloxane represented by the following average unit formula:

$(PhSiO_{3/2})_{0.75}(ViMe_2SiO_{1/2})_{0.25}$ (content of vinyl groups=5.6 mass %; content of phenyl groups in all silicon-bonded organic groups=50 mole %);

15 parts by mass of a methylphenylpolysiloxane capped at both molecular terminals with dimethylvinylsiloxy groups (content of vinyl groups=1.5 mass %; content of phenyl groups in all silicon-bonded organic groups=49 mole %);

23 parts by mass of a linear-chain organopolysiloxane represented by the following formula:

$HMe_2SiO(Ph_2SiO)SiMe_2H$ (content of silicon-bonded hydrogen atoms=0.60 mass %; content of phenyl groups in all silicon-bonded organic groups=33 mole %);

2 parts by mass of a branched-chain organopolysiloxane represented by the following average unit formula:

$(PhSiO_{3/2})_{0.60}(HMe_2SiO_{1/2})_{0.40}$ (content of silicon-bonded hydrogen atoms=0.65 mass %; content of phenyl groups in all silicon-bonded organic groups=25 mole %; number-average molecular weight=2,260);

a platinum-1,3-divinyl-1,1,3,3-tetramethyl disiloxane complex (used in the composition in such an amount that in terms of mass units the content of the metallic platinum of the complex was 2.5 ppm); and 0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Comparative Example 1

A curable organopolysiloxane composition having a viscosity of 3,300 mPa·s was prepared by uniformly mixing the following components:

70 parts by mass of a branched-chain represented by the following average unit formula:

$(PhSiO_{3/2})_{0.75}(ViMe_2SiO_{1/2})_{0.25}$ (content of vinyl groups=5.6 mass %; content of phenyl groups in all silicon-bonded organic groups=50 mole %);
30 parts by mass of a linear-chain organopolysiloxane of the following formula:

$HMe_2SiO(Ph_2SiO)SiMe_2H$ (content of silicon-bonded hydrogen atoms=0.60 mass %; content of phenyl groups in all silicon-bonded organic groups=33 mole %);
a platinum-1,3-divinyl-1,1,3,3-tetramethyl disiloxane complex (used in the composition in such an amount that in terms of mass units the content of the metallic platinum of the complex was 2.5 ppm); and
0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Comparative Example 2

A curable organopolysiloxane composition having a viscosity of 9,500 mPa·s was prepared by uniformly mixing the following components:
68 parts by mass of a branched-chain organopolysiloxane represented by the following average unit formula:

$(PhSiO_{3/2})_{0.75}(ViMeSiO_{2/2})_{0.10}(Me_2SiO_{2/2})_{0.15}$ (content of vinyl groups=2.3 mass %; content of phenyl groups in all silicon-bonded organic groups=60 mole %);
32 parts by mass of a methylphenylpolysiloxane capped at both molecular terminals with dimethylhydrogensiloxy groups (content of silicon-bonded hydrogen atoms=0.20 mass %; content of phenyl groups in all silicon-bonded organic groups=34 mole %);
2 parts by mass of an organopolysiloxane represented by the following average unit formula:

$(EpSiO_{3/2})_{0.3}(ViMeSiO_{2/2})_{0.3}(Me_2SiO_{2/2})_{0.3}(MeO_{1/2})_{0.2}$ a platinum-1,3-divinyl-1,1,3,3-tetramethyl disiloxane complex (used in the composition in such an amount that in terms of mass units the content of the metallic platinum of the complex was 2.5 ppm); and
0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Comparative Example 3

A curable organopolysiloxane composition having a viscosity of 3,500 mPa·s was prepared by uniformly mixing the following components:
60 parts by mass of a branched-chain organopolysiloxane represented by the following average unit formula:

$(PhSiO_{3/2})_{0.75}(ViMe_2SiO_{1/2})_{0.25}$ (content of vinyl groups=5.6 mass %; content of phenyl groups in all silicon-bonded organic groups=50 mole %);
15 parts by mass of a methylphenylpolysiloxane capped at both molecular terminals with dimethylvinylsiloxy groups (content of vinyl groups=1.5 mass %; content of phenyl groups in all silicon-bonded organic groups=49 mole %);
13 parts by mass of a linear-chain organopolysiloxane represented by the following formula:

$HMe_2SiO(Ph_2SiO)SiMe_2H$ (content of silicon-bonded hydrogen atoms=0.60 mass %; content of phenyl groups in all silicon-bonded organic groups=33 mole %);
12 parts by mass of a branched-chain organopolysiloxane represented by the following average unit formula:

$(PhSiO_{3/2})_{0.60}(HMe_2SiO_{1/2})_{0.40}$ (content of silicon-bonded hydrogen atoms=0.65 mass %; content of phenyl groups in all silicon-bonded organic groups=25 mole %);
a platinum-1,3-divinyl-1,1,3,3-tetramethyl disiloxane complex (used in the composition in such an amount that in terms of mass units the content of the metallic platinum of the complex was 2.5 ppm); and
0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

TABLE 1

|  | Examples | | | | | |
|---|---|---|---|---|---|---|
|  | Practical Examples | | | Comparative Examples | | |
| Characteristics | 1 | 2 | 3 | 1 | 2 | 3 |
| Index of refraction | 1.542 | 1.533 | 1.534 | 1.545 | 1.534 | 1.532 |
| Characteristics of Cured Product | | | | | | |
| Light transmittance (%) | 99.9 | 99.2 | 99.8 | 99.9 | 99.1 | 99.7 |
| Type D Hardness | 70 | 72 | 35 | 68 | 70 | 50 |
| Adhesive strength (MPa) | | | | | | |
| Polyphthalamide resin plate | 9 | 13 | 8 | 5 | 6 | 2 |
| Aluminum plate | 10 | 13 | 8 | 7 | 8 | 3 |

TABLE 1-continued

| | Examples | | | | | |
|---|---|---|---|---|---|---|
| | Practical Examples | | | Comparative Examples | | |
| Characteristics | 1 | 2 | 3 | 1 | 2 | 3 |
| Percentage of peeling (%) | | | | | | |
| Initial | 0 | 0 | 0 | 0 | 12.5 | 0 |
| After retention at constant temperature and humidity | 0 | 0 | 0 | 25 | 68.8 | 43.8 |
| After holding for 30 sec. at 280° C. | 0 | 1.3 | 0 | 18.8 | 100 | 100 |
| After thermal shock cycle | 1.3 | 1.3 | 0 | 81.3 | 100 | 100 |

INDUSTRIAL APPLICABILITY

The curable organopolysiloxane composition of the invention can be used as an adhesive, potting agent, protective agent, coating agent, or an underfill agent for parts of electrical and electronic devices. In particular, since the composition has high light-transmittance, it is suitable for use as an adhesive, potting agent, protective agent, or an underfill agent for semiconductor parts of optical devices. The semiconductor device of the invention can be embodied into diodes, light-emitting diodes (LED's), transistors, thyristors, photocouplers, CCD, monolithic IC's, hybrid IC's, LSI's, or VLSI's.

The invention claimed is:

1. A curable organopolysiloxane composition comprising:
 (A) a branched-chain organopolysiloxane that contains in one molecule at least three alkenyl groups and at least 30 mole % of all silicon-bonded organic groups in the form of aryl groups;
 (B) a linear-chain organopolysiloxane that contains aryl groups and has both molecular terminals capped with diorganohydrogensiloxy groups, wherein component (B) is used in such an amount that the content of silicon-bonded hydrogen atoms contained in component (B) to one mole of alkenyl groups contained in component (A) is in the range of 0.5 to 2 moles;
 (C) a branched-chain organopolysiloxane that contains in one molecule at least three diorganohydrogensiloxy groups and at least 15 mole % of all silicon-bonded organic groups are in the form of aryl groups, wherein the content of the diorganohydrogensiloxy groups contained in this component is in the range of 1 to 20 mole % per total amount of the diorganohydrogensiloxy groups contained in component (B) and in the present component;
 (D) a hydrosilylation catalyst in an amount required to accelerate curing of the composition; and
 (E) a linear-chain organopolysiloxane that contains in one molecule at least two alkenyl groups and at least 30 mole % of all silicon-bonded organic groups in the form of aryl groups, said component (E) being used in an amount of greater than 0 and equal to or less than 25 parts by mass per 100 parts by mass of component (A).

2. The curable organopolysiloxane composition of claim 1, wherein component (A) is a branched-chain organopolysiloxane of the following average unit formula:

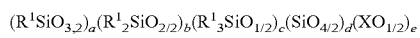

{wherein $R^1$ independently designates substituted or unsubstituted monovalent hydrocarbon groups; however, in one molecule at least three groups designated by $R^1$ are alkenyl groups and at least 30 mole % of all groups designated by $R^1$ are aryl groups; X designates a hydrogen atom or an alkyl group; and "a" is a positive number, "b" is 0 or a positive number, "c" is 0 or a positive number, "d" is 0 or a positive number, "e" is 0 or a positive number, "b/a" is a number ranging from 0 to 10, "c/a" is a number ranging from 0 to 5, "d/(a+b+c+d)" is a number ranging from 0 to 0.3, and "e/(a+b+c+d)" is a number ranging from 0 to 0.4}.

3. The curable organopolysiloxane composition of claim 1, wherein component (B) is a linear-chain organopolysiloxane represented by the following general formula:

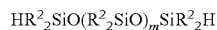

(wherein each $R^2$ independently designates a substituted or unsubstituted univalent hydrocarbon group, which is free of unsaturated aliphatic bonds; however, in one molecule at least 15 mole % of all groups designated by $R^2$ are aryl groups; and "m" is an integer ranging from 1 to 1,000).

4. The curable organopolysiloxane composition of claim 1, wherein component (C) is a branched-chain organopolysiloxane of the following average unit formula:

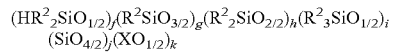

{wherein each $R^2$ independently designates a univalent hydrocarbon group, which is free of unsaturated aliphatic bonds; however, in one molecule at least 15 mole % of all groups designated by $R^2$ are aryl groups; X designates a hydrogen atom or an alkyl group; and "f" is a positive number, "g" is a positive number, "h" is 0 or a positive number, "i" is 0 or a positive number, "j" is 0 or a positive number, "k" is 0 or a positive number, "f/g" is a number ranging from 0.1 to 4, "h/g" is a number ranging from 0 to 10, "i/g" is a number ranging from 0 to 5,
"j/(f+g+h+i+j)" is a number ranging from 0 to 0.3, and "k/(f+g+h+i+j)" is a number ranging from 0 to 0.4}.

5. The curable organopolysiloxane composition of claim 1, wherein the index of refraction (at 25° C.) in a visible light (589 nm) is equal to or greater than 1.5.

6. The curable organopolysiloxane composition of claim 1, wherein a cured product obtained by curing the composition has type D durometer hardness equal to or greater than 20.

7. The curable organopolysiloxane composition of claim 1, wherein a cured product obtained by curing the composition has light transmittance (at 25° C.) that is equal to or greater than 80%.

8. A semiconductor device that contains a semiconductor part comprising a cured product of the curable organopolysiloxane composition according to claim 1.

9. The semiconductor device of claim 8, wherein the semiconductor part is a light-emitting element.

10. The curable organopolysiloxane composition of claim 1, wherein component (A) contains in one molecule at least three vinyl groups and at least 40 mole % of all silicon-bonded organic groups in the form of phenyl groups.

11. The curable organopolysiloxane composition of claim 2, wherein, in one molecule of component (A);
the alkenyl groups designated by $R^1$ are vinyl groups, and
the at least 30 mole % of all groups designated by $R^1$ which are aryl groups comprise at least 40 mole % phenyl groups.

12. The curable organopolysiloxane composition of claim 1, wherein, in one molecule of component (B), at least 15 mole % of all silicon-bonded organic groups are aryl groups.

13. The curable organopolysiloxane composition of claim 3, wherein, in one molecule of component (B), at least 30 mole % of all groups designated by $R^2$ are aryl groups, and "m" is an integer ranging from 1 to 100.

14. The curable organopolysiloxane composition of claim 1, wherein, in one molecule of component (C), at least 25 mole % of all silicon-bonded organic groups are in the form of phenyl groups.

\* \* \* \* \*